United States Patent [19]
Hasegawa et al.

[11] Patent Number: 6,078,640
[45] Date of Patent: Jun. 20, 2000

[54] X-RAY EXPOSURE APPARATUS

[75] Inventors: Takayuki Hasegawa; Takeshi Miyachi, both of Utsunomiya, Japan

[73] Assignee: Canon Kabushiki Kaisha, Tokyo, Japan

[21] Appl. No.: 09/106,893

[22] Filed: Jun. 30, 1998

[30]   Foreign Application Priority Data

Jul. 1, 1997   [JP]   Japan ..................................... 9-188958
  Jan. 26, 1998  [JP]   Japan ................................... 10-026337

[51] Int. Cl.⁷ ...................................................... G21K 5/00
[52] U.S. Cl. ........................................... 378/34; 250/492.2
[58] Field of Search ........................... 378/34; 250/492.2; 359/359, 366

[56]          References Cited
         U.S. PATENT DOCUMENTS 5,329,126   7/1994   Amemiya et al. ......................... 378/34

*Primary Examiner*—Craig E. Church
*Attorney, Agent, or Firm*—Fitzpatrick, Cella, Harper & Scinto

[57]          ABSTRACT

An exposure method and apparatus for lithographically transferring a pattern of a mask onto a substrate to be exposed, wherein a detecting system detects a relative positional relation between the mask and the substrate with respect to at least a predetermined direction, a stage member changes the relative positional relation between the mask and the substrate, on the basis of the detection by the detecting system, a magnification correcting mechanism corrects a transfer magnification of the mask pattern to the substrate, a control system for the stage member corrects one of a drive amount of the stage member and a detection result of the detecting system in accordance with a positional deviation of the mask pattern attributable to the correction operation of the magnification correcting mechanism.

12 Claims, 7 Drawing Sheets

X-RAY EXPOSURE APPARATUS

FIELD OF THE INVENTION AND RELATED ART

This invention relates to an X-ray exposure apparatus for use in the manufacture of semiconductor devices, for example.

Miniaturization of circuit patterns has been enhanced for an increase of operation speed and integration of a solid device such as LSI. For formation of a circuit pattern in LSI manufacturing processes, as a future exposure technique, a fine pattern forming process which is based on high luminance X-rays from a synchrotron orbit radiation (SOR), for example, is attractive. Generally, X-ray exposure methods include a proximity unit-magnification X-ray exposure method which uses those of soft X-rays having a wavelength of 0.5–2 nm, and a reduction projection exposure method which uses a reflection type mask and a wavelength of 4–20 nm.

An example of the former is proposed in Japanese Laid-Open Patent Application, Laid-Open No. 100311/1990. In this method, because of a short exposure wavelength, in principle, there is a possibility of high resolution not larger than 0.1 micron. The proximity unit-magnification X-ray exposure method uses a transmission type mask, called a "unit-magnification X-ray mask". The portion of such a unit-magnification X-ray mask through which X-rays are transmitted is made of a light element material such as SiN·SiC, called a "membrane". It comprises a thin film having a thickness of about 2 microns, and a size 35 mm square. As for an X-ray absorbing portion of the unit-magnification X-ray mask, a circuit pattern made of heavy metal such as Ta or W, called an "absorptive material", having a thickness of about 0.5–1.0 micron, is formed on the membrane. Also, an optical system in the proximity unit-magnification X-ray exposure method serves to enlarge X-rays from a light source into a predetermined field size by use of an X-ray mirror, and through the X-ray mask it serves to transfer the pattern onto a wafer substrate, disposed opposed to the X-ray mask.

However, an apparatus to be used in the proximity unit-magnification X-ray exposure method such as described above differs from a conventional optical exposure apparatus using ultraviolet rays, for example, and it is difficult to variably set the exposure transfer magnification, to be transferred onto a wafer substrate, by use of the X-ray optical system. More specifically, it is difficult to correct magnification with the X-ray optical system, whereas the magnification in an optical exposure apparatus can be corrected with an optical system having lens groups.

As for correction of magnification in X-ray exposure apparatuses, a method has been proposed in which a mask substrate is positively deformed to thereby control the pattern magnification on a membrane. For example, an example wherein a plane stress is applied to a mask substrate is disclosed in Japanese Published Patent Application, Publication No. 66095/1992. In this method, a clamping mechanism for a mask chuck is provided with mechanical means (electrostrictive device) and, as a result of application of deformation to a mask supporting frame, the mask substrate on the supporting frame is elongated or contracted.

With the pattern magnification correcting mechanism for an X-ray exposure apparatus such as described above, however, a stress along a plane or not along a plane is applied to the mask to press the mask against a reference surface, for example, to thereby cause deformation of it and correct the pattern magnification. This causes positional deviation of the pattern, and it raises a problem of degradation of pattern registration precision.

SUMMARY OF THE INVENTION

It is an object of the present invention to provide an X-ray exposure apparatus by which high precision exposure is assured regardless of mask magnification correction.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
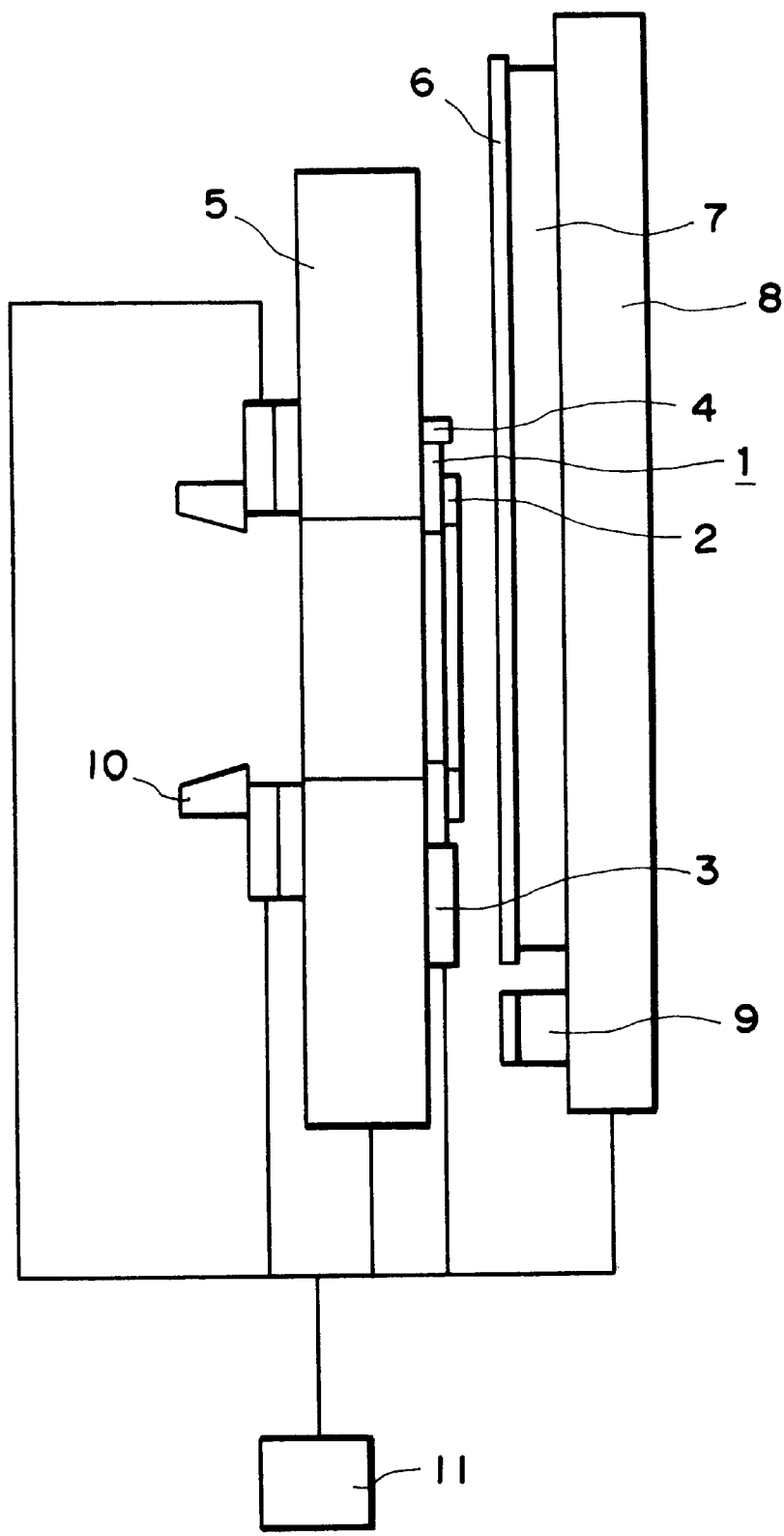
FIG. 1 is a schematic view of an exposure apparatus according to a first embodiment of the present invention

FIG. 1 shows the structure of a proximity unit-magnification X-ray exposure apparatus according to a first embodiment of the present invention. Denoted in FIG. 1 at 1 is a mask, and denoted at 2 is a thin plate (mask substrate) on which a membrane of the mask 1 is formed by deposition. Denoted at 3 is a mask magnification correcting mechanism of the type as disclosed in Japanese Published Patent Application, Publication No. 99095/1992, for example. Denoted at 4 is a mask abutment pin, and denoted at 5 is a mask chuck. Denoted at 6 is a semiconductor wafer, and denoted at 7 is a wafer chuck. Denoted at 8 is a wafer stage. Denoted at 9 is a reference mark for measurement of coordinates of an alignment mark on the mask 1. Denoted at 10 is a measuring system (pickup) for measurement of positional deviation, along a plane, between an alignment mark of the mask and an alignment mark of the wafer (hereinafter, "autoalignment measurement"), and for measurement of a gap between the mask and the wafer (hereinafter, "autofocus measurement"). The autoalignment (AA) measurement may be made in accordance with a method as disclosed in U.S. Pat. No. 5,327,221, for example, and the autofocus (AF) measurement may be made in accordance with a method as disclosed in U.S. Pat. No. 5,343,291, for example. Denoted at 11 is a controller for controlling the exposure apparatus.

Figure 2A:
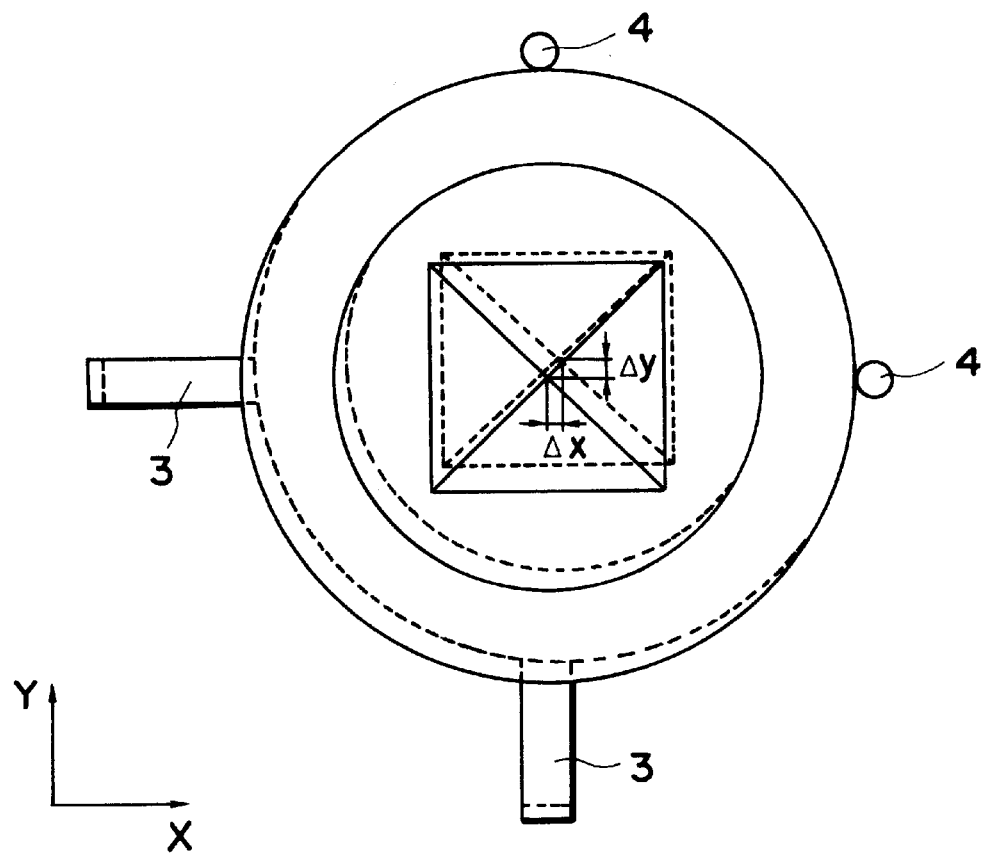
FIGS. 2A and 2B are schematic views, respectively, for explaining positional deviation of a pattern resulting from mask magnification correction.
Figure 2B:
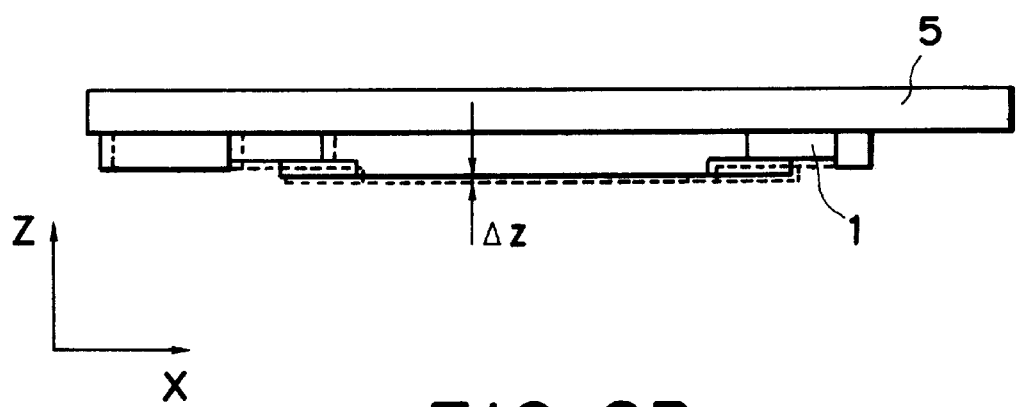

FIGS. 2A and 2B illustrate displacement of a mask pattern resulting from mask magnification correction.

Now, a process of determining a stage drive pattern (drive locus) for a global alignment operation with the controller in accordance with the present invention will be explained.

Initially, first time global autoalignment measurement and autofocus measurement are carried out. From the results of these measurements, the magnification of the pattern upon the wafer is calculated. If, from this result, the mask magnification correction is required, the magnification correcting mechanism 3 is used to change it. As shown in FIG. 2A or 2B, the mask pattern displaces by ($\Delta x$, $\Delta y$, $\Delta z$) as a result of mask magnification correction. For correction of this amount, global autoalignment measurement and autofocus measurement are repeated once again. On the basis of the results, a stage drive pattern is determined and wafer exposure is carried out.

Figure 3:
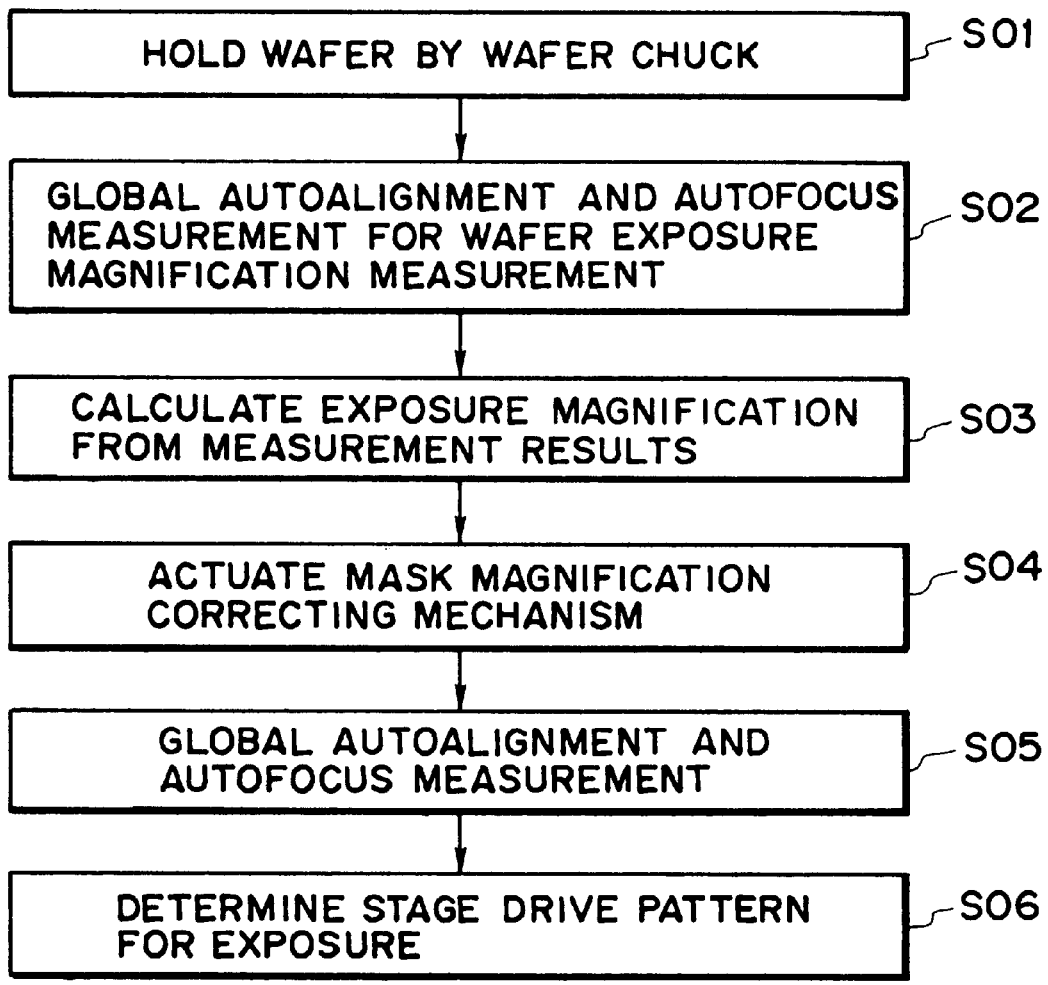
FIG. 3 is a flow chart for explaining global autoalignment (AA) and autofocus (AF) measurement in the first embodiment of the present invention.

FIG. 3 illustrates this global alignment sequence (steps S01–S06), in a flow chart.

With the global alignment sequence such as described above, displacement of a mask pattern resulting from mask magnification correction can be corrected and thus high precision pattern registration is assured.

Figure 4A:
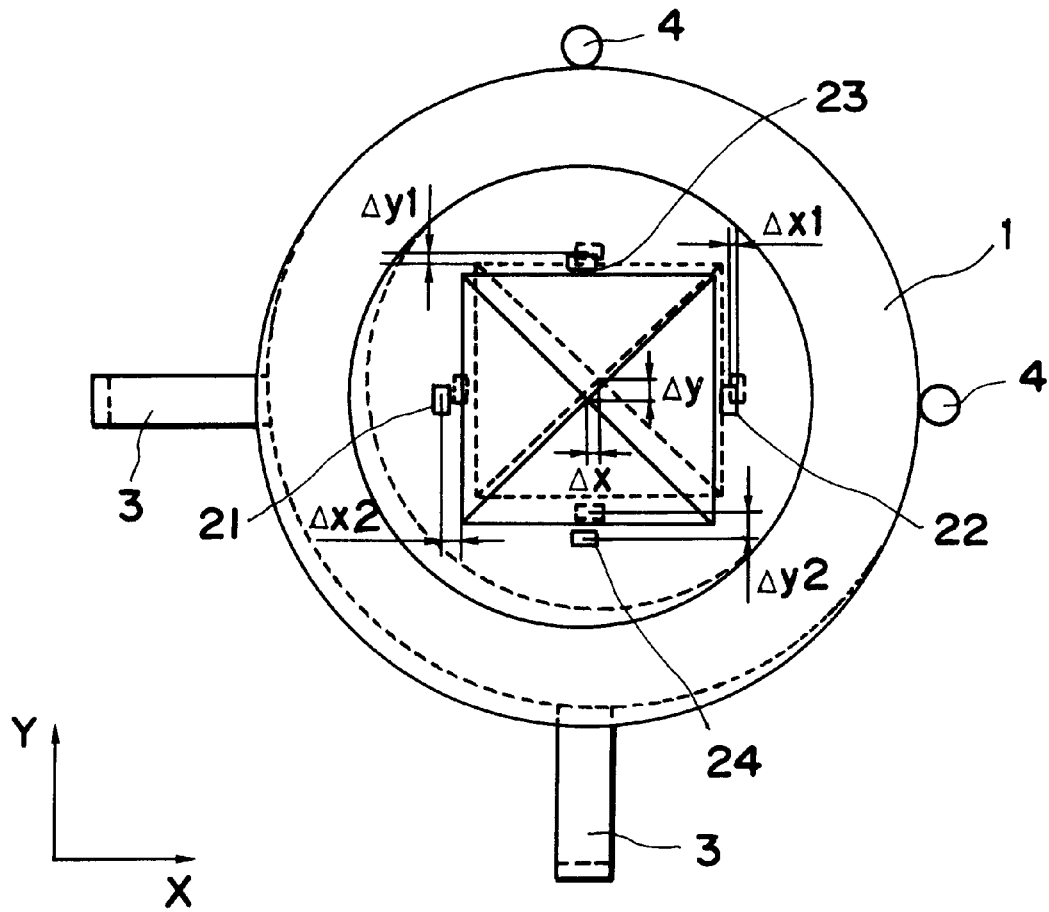
FIGS. 4A and 4B are schematic views, respectively, for explaining a process for measuring positional deviation of a pattern resulting from mask magnification correction, in a second embodiment of the present invention.
Figure 4B:
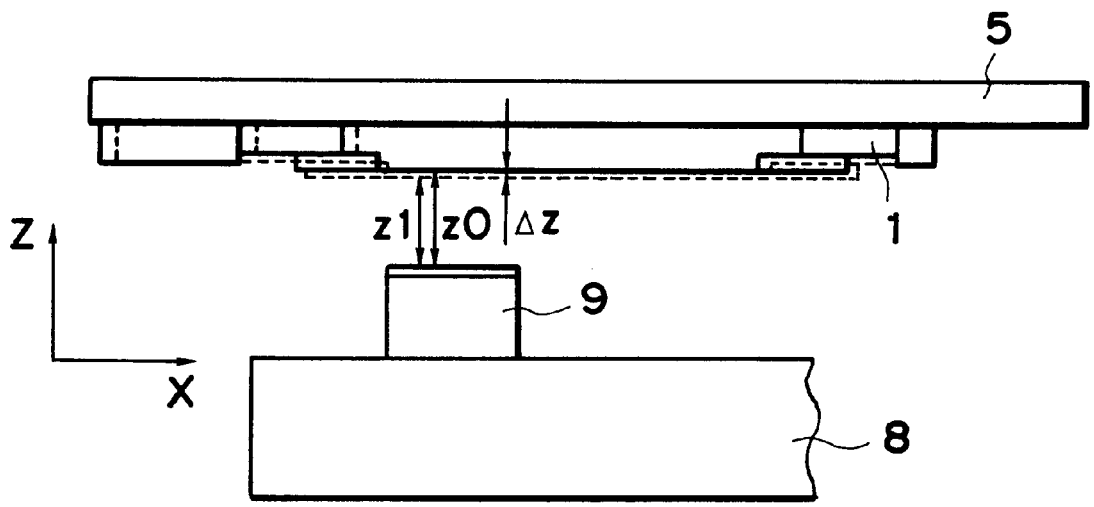
Figure 5:
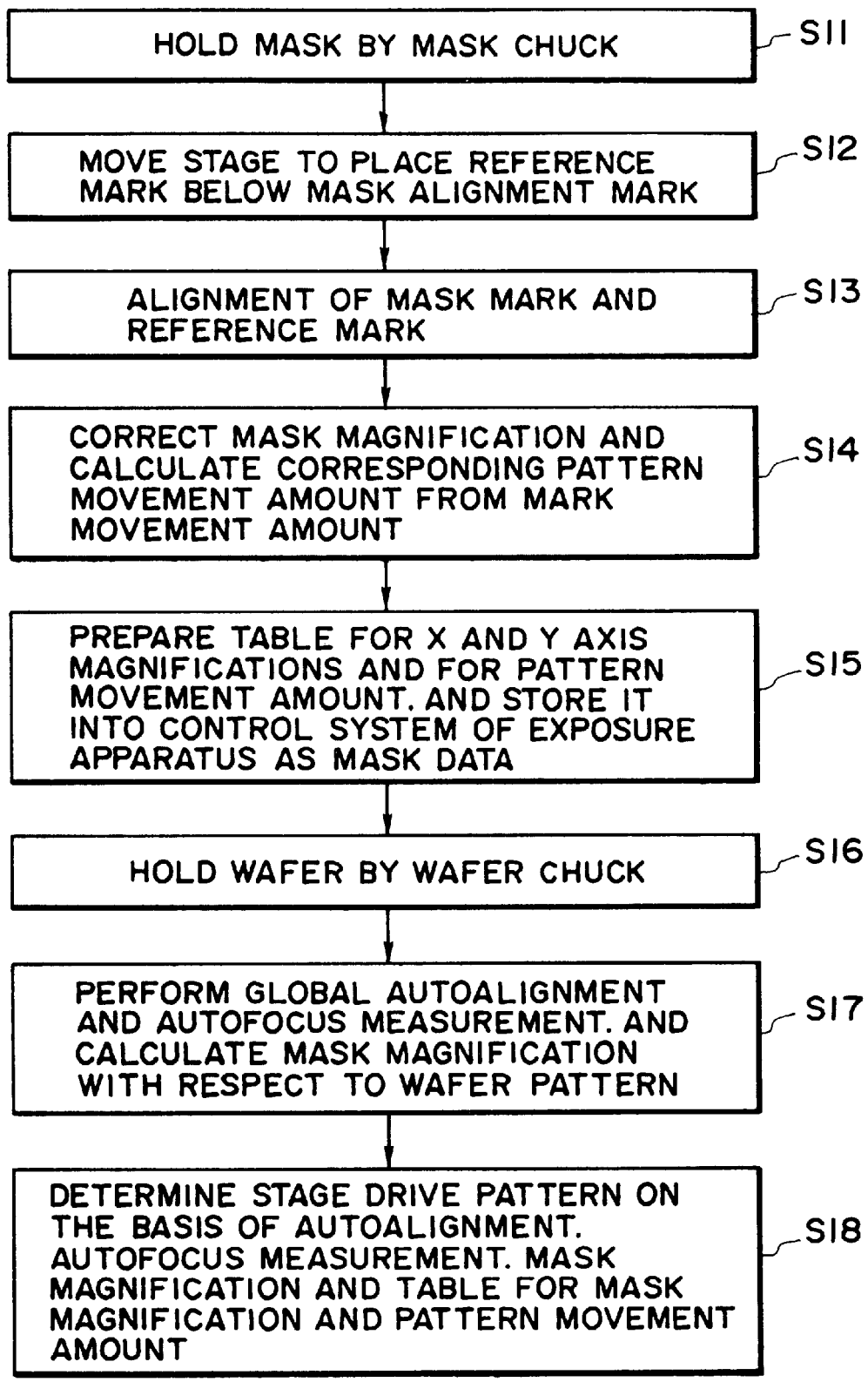
FIG. 5 is a flow chart for explaining global autoalignment (AA) and autofocus (AF) measurement in the second embodiment of the present invention.

FIGS. 4A and 4B illustrate displacement of an alignment mark of a mask upon mask magnification correction, in a second embodiment of the present invention. Denoted in FIGS. 4A and 4B at 21–24 are alignment marks on a mask. In accordance with the second embodiment, for further increases of throughput as compared with the first embodiment, displacement of the pattern due to mask magnification correction is stored into the exposure apparatus beforehand in the form of a table. FIG. 5 illustrates the measurement sequence in the second embodiment, in the form of a flow chart. The operation according to this embodiment will be described below, with reference to FIGS. 1, 4A, 4B and 5.

Table preparation and a storing procedure are carried out as below. First, the mask 1 is placed on the mask chuck 5. Then, the stage 8 is driven while executing autoalignment (AA) and autofocus (AF) measurement using the pickup 10, so that an alignment mark on the reference mark 9 is placed just below the mark 21 of the mask, with a predetermined gap thereto. The coordinates of the stage at this moment are stored into the controller 11. This procedure is repeated with respect to the marks 22–24 similarly, and the coordinates of the mask alignment marks 21–24 are determined. Subsequently, the mask magnification correcting mechanism 3 is actuated to change the magnification of the mask. After a predetermined magnification is set, the reference mark 9 is moved to the position of wafer alignment mark 21 coordinates as having been measured. Then, autoalignment and autofocus measurement is carried out, and the amount of mark displacement is measured. This procedure is repeated for the marks 22–24 similarly, and displacement amounts ($\Delta x_1$, $\Delta x_2$, $\Delta y_1$, $\Delta y_2$) of respective marks are measured. Also, a gap change $\Delta z$ is measured. Then, from the displacement amounts of the four marks 21–24, the displacement amount ($\Delta x$, $\Delta y$) of the center of the mask is calculated. The above-described measurement procedure is carried out a predetermined number of times, for various magnifications, whereby a table of mask center displacement ($\Delta x$, $\Delta y$, $\Delta z$) with mask magnification is prepared. The resultant is stored into the controller 11.

For the exposure procedure, first the wafer 6 is placed on and chucked by the wafer chuck 7 and, then, autoalignment and autofocus measurement for global alignment is performed.

From the results, the position of a pattern already printed on the wafer and the magnification thereof are calculated. Here, while the stage drive pattern for the wafer exposure can be determined, displacement of the mask center resulting from the magnification correction is detected from the table and the stage drive pattern is corrected in accordance with the displacement.

Subsequently, while moving the wafer stepwise in accordance with the corrected drive pattern, exposures of shot areas of the wafer are carried out (step-and-repeat exposure).

After exposures of all shot areas on one wafer are completed, the exposed wafer is unloaded and the above-described exposure procedure is repeated to a subsequent wafer.

With the preparation of a table for mask magnification and mask center displacement such as described above, the necessity of additional autoalignment and autofocus measurement after magnification correction is removed, such that the throughput is improved.

In this embodiment, the mask magnification and mask center displacement are measured with the mask 1 being loaded in the exposure apparatus. However, a table may be prepared on the basis of measurement made by use of a device, separate from the exposure apparatus and, when the mask 1 is loaded into the exposure apparatus, mask data may be downloaded to the controller 1 as the mask inherent data. Substantially the same advantageous results are obtainable on that occasion, as a matter of course.

For preparation of the table, the relationship between the magnification and the mask center displacement may be determined by simulation and a table may be prepared on the basis of it. Alternatively, the positions of printed patterns with mask magnification correction and without mask magnification correction, respectively, may be measured and the mask center displacements in these cases may be detected, for preparation of a table.

Further, while the above-described embodiment has been explained with reference to an example wherein both autoalignment measurement and autofocus measurement are carried out, the present invention is applicable also to a case where only one of autoalignment measurement and autofocus measurement is carried out.

Although the invention has been described with reference to a case of global alignment, it is similarly applicable to a case of die-by-die alignment. With the preparation of a table, the stage driving amount for alignment can be corrected on the basis of a pattern positional deviation amount, by which the alignment operation time can be reduced.

Next, an embodiment of a device manufacturing method which uses an exposure apparatus or exposure method such as described above, will be explained.

Figure 6:
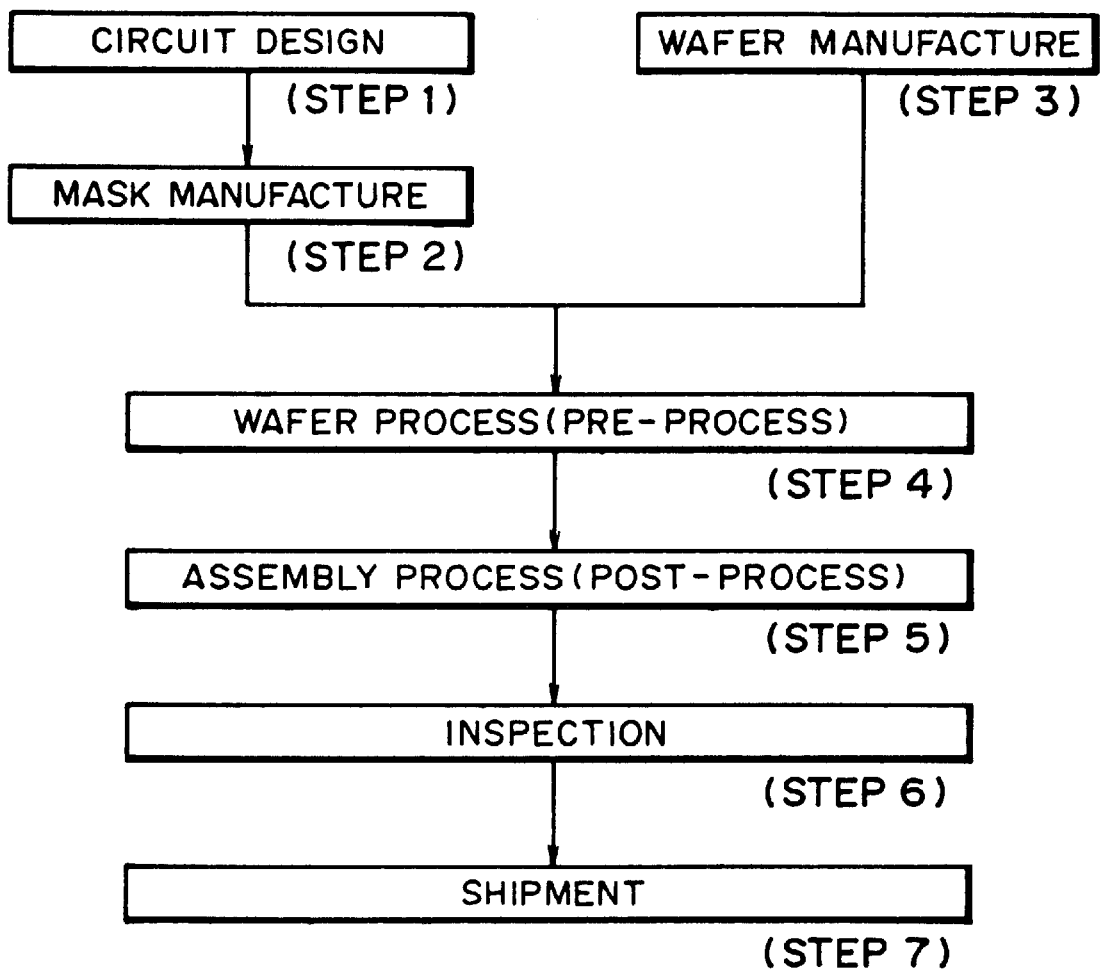
FIG. 6 is a flow chart of microdevice manufacturing processes.

FIG. 6 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 7:
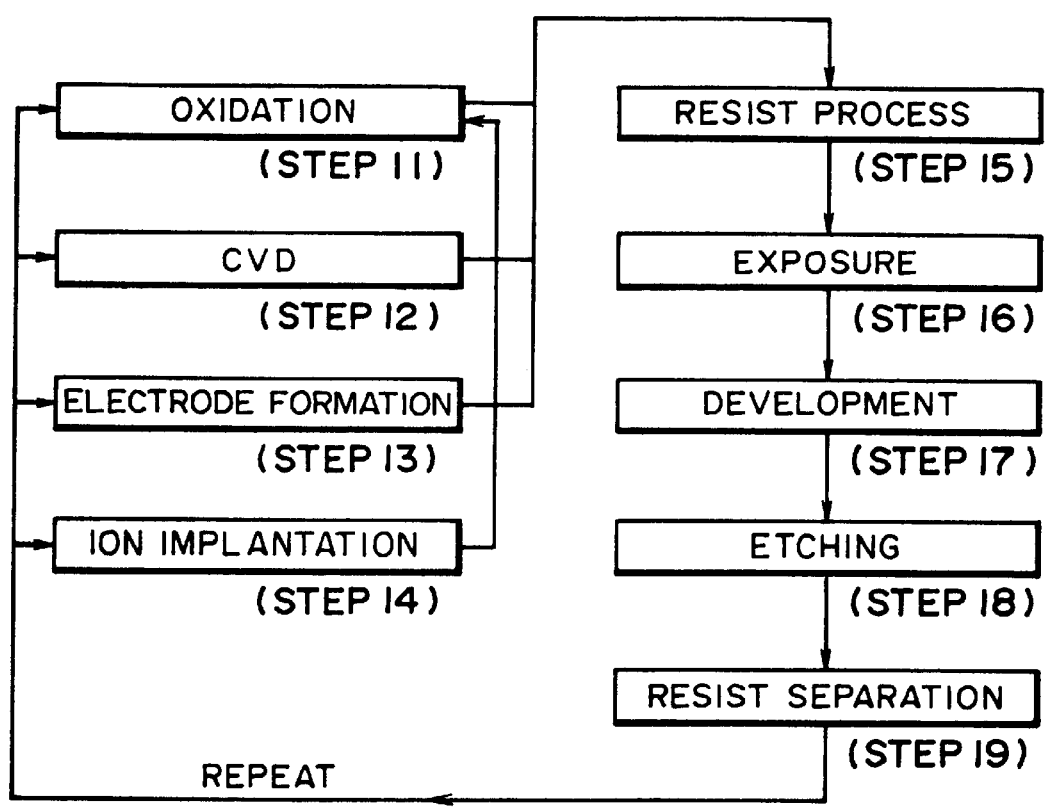
FIG. 7 is a flow chart for explaining details of a wafer process in the procedure of FIG. 6.

FIG. 7 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured at lower cost.

In accordance with the embodiments of the present invention as described above, an autoalignment or autofocus measured value or a stage driving amount is corrected on the basis of a mask pattern positional deviation amount produced by a mask magnification correcting mechanism of an X-ray exposure apparatus. Thus, even with the magnification correction, degradation of pattern registration precision can be prevented.

A table for the mask magnification correction amount and pattern displacement amount due to the correction may be prepared in a controller of an exposure apparatus such that the amount of positional deviation resulting from mask magnification correction may be calculated by using the table and that an autoalignment or autofocus measured value or a stage driving amount may be then corrected. This eliminates the necessity of autoalignment or autofocus measurement for correction of positional deviation of a mask pattern, for every wafer, due to mask magnification correction. This enables an increase of throughput.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for lithographically transferring a pattern of a mask onto a substrate to be exposed, comprising:

a detecting system for detecting a relative positional relation between the mask and the substrate with respect to at least a predetermined direction;

a stage member for changing the relative positional relation between the mask and the substrate, on the basis of the detection by said detecting system;

a magnification correcting mechanism for correcting a transfer magnification of the mask pattern to the substrate; and a control system for said stage member, for correcting one of a drive amount of said stage member and a detection result of said detecting system in accordance with a positional deviation of the mask pattern attributable to the correction operation of said magnification correcting mechanism.

2. An apparatus according to claim 1, wherein said control system serves to cause said detecting system to execute the detection again after the magnification correction through said magnification correcting mechanism, and wherein the positional deviation is determined on the basis of the result of the second-time detection.

3. An apparatus according to claim 1, wherein said control system has a table related to the amount of magnification correction by said magnification correcting mechanism and to pattern displacement at different locations on the mask due to the magnification correction, and wherein the positional deviation is calculated on the basis of the table.

4. An apparatus according to claim 1, wherein said magnification correction changes the magnification on the basis of mask deformation.

5. An apparatus according to claim 1, wherein transfer of the mask pattern to the substrate is made on the basis of exposure using X-rays.

6. An apparatus according to claim 1, wherein transfer of the mask pattern to the substrate is made while the mask is disposed opposed to and in proximity to the substrate.

7. An apparatus according to claim 1, wherein said detecting system has at least one of a function for detecting a relative positional relation between the mask and the substrate in the direction of opposition of the mask and the substrate, and a function for detecting the relative positional relation between the mask and the substrate along a plane perpendicular to the direction of opposition.

8. An apparatus according to claim 1, wherein said control system corrects the amount of stepwise motion of the substrate through said stage member during a step-and-repeat exposure operation, in accordance with the positional deviation of the mask pattern attributable to the correcting operation of said magnification correcting mechanism.

9. A semiconductor device manufacturing method which uses an exposure apparatus for lithographically transferring a pattern of a mask onto a substrate to be exposed, said method comprising the steps of:

detecting a relative positional relation between the mask and the substrate with respect to at least a predetermined direction;

adjusting the relative positional relation between the mask and the substrate, on the basis of said detection;

correcting a transfer magnification of the mask pattern to the substrate;

correcting one of said adjustment of the relative positional relation and said detection, in accordance with a positional deviation of the mask pattern attributable to said magnification correction; and transferring, by exposure, the pattern of the mask onto the substrate whose relative positional relation has been adjusted.

10. A method according to claim 9, wherein said detection and adjustment are performed with respect to at least one of a direction of opposition between the mask and the substrate, and a direction along a plane perpendicular to the opposition direction.

11. A method according to claim 9, wherein the substrate is a wafer.

12. A method according to claim 9, wherein the transfer is made on the basis of X-ray exposure.

* * * * *